(12) United States Patent
Froman

(10) Patent No.: US 10,574,066 B2
(45) Date of Patent: Feb. 25, 2020

(54) INTEGRATED CAPACITIVE DISCHARGE ELECTRICAL BONDING ASSURANCE SYSTEM

(71) Applicant: Bell Helicopter Textron Inc., Fort Worth, TX (US)

(72) Inventor: Gary S. Froman, Ft. Worth, TX (US)

(73) Assignee: BELL HELICOPTER TEXTRON INC., Fort Worth, TX (US)

( * ) Notice: Subject to any disclaimer, the term of this patent is extended or adjusted under 35 U.S.C. 154(b) by 158 days.

(21) Appl. No.: 15/830,875

(22) Filed: Dec. 4, 2017

(65) Prior Publication Data

US 2019/0173296 A1 Jun. 6, 2019

(51) Int. Cl.

| G01R 27/26 | (2006.01) |
|---|---|
| H02J 7/00 | (2006.01) |
| G01R 31/02 | (2006.01) |
| B64D 45/02 | (2006.01) |
| H02H 5/10 | (2006.01) |
| B64D 43/00 | (2006.01) |
| G01R 31/00 | (2006.01) |
| H02J 7/34 | (2006.01) |
| H02H 1/00 | (2006.01) |
| H02H 3/04 | (2006.01) |
| H05F 1/00 | (2006.01) |

(52) U.S. Cl.
CPC ........... *H02J 7/0022* (2013.01); *B64D 43/00* (2013.01); *B64D 45/02* (2013.01); *G01R 31/001* (2013.01); *G01R 31/008* (2013.01); *G01R 31/025* (2013.01); *H02H 5/105* (2013.01); *H02J 7/345* (2013.01); *B64D 2221/00* (2013.01); *H02H 1/003* (2013.01); *H02H 3/04* (2013.01); *H05F 1/00* (2013.01)

(58) Field of Classification Search
USPC ................................ 324/503, 452, 457, 658
See application file for complete search history.

(56) References Cited

U.S. PATENT DOCUMENTS

| 3,060,417 A | 10/1962 | Blake |
|---|---|---|
| 3,694,754 A * | 9/1972 | Baltzer ............... H04B 1/10 455/287 |
| 3,857,066 A | 12/1974 | Cline et al. |

(Continued)

FOREIGN PATENT DOCUMENTS

| CA | 2599079 C | 4/2013 |
|---|---|---|
| EP | 2860840 B1 | 5/2017 |
| FR | 2236185 A1 | 1/1975 |

OTHER PUBLICATIONS

EPO Examination Report for EP Application No. 18208166.1 dated Apr. 16, 2019, 5 pages.

(Continued)

*Primary Examiner* — Vincent Q Nguyen
(74) *Attorney, Agent, or Firm* — Patent Capital Group

(57) ABSTRACT

In one embodiment, an aircraft electronics system includes a hardware processor, a charge collection circuit to collect charge; a switching circuit controlled by the hardware processor to discharge the charge collected on the charge collection circuit through a bonding circuit formed from a chassis and a bonding surface; and a voltage measurement circuit to measure a voltage difference between measurement terminals across the chassis and the bonding surface.

16 Claims, 3 Drawing Sheets

(56) References Cited

U.S. PATENT DOCUMENTS

| | | | | |
|---|---|---|---|---|
| 4,931,740 A | * | 6/1990 | Hassanzadeh | G01V 3/088 |
| | | | | 324/109 |
| 4,980,795 A | * | 12/1990 | Moore | B64D 45/02 |
| | | | | 361/218 |
| 7,592,783 B1 | * | 9/2009 | Jarvinen | H02N 1/04 |
| | | | | 290/1 A |

OTHER PUBLICATIONS

EPO Search Report issued in EP Application 18208166.1 dated Apr. 5, 2019, 4 pages.

* cited by examiner

INTEGRATED CAPACITIVE DISCHARGE ELECTRICAL BONDING ASSURANCE SYSTEM

TECHNICAL FIELD

This disclosure relates generally to electronics systems and, more particularly, to techniques for providing electrical bonding assurance in such systems.

BACKGROUND

In aircraft, electrical bonding of electrical components to a common potential prevents static electricity build-up and provides a discharge path for electromagnetic interference (EMI) filtering that can interfere with electronics and computer functions. Electrical bonding also provides protection from ill effects of lightning strikes by allowing the current to pass through the airframe with minimum high voltage effects to sensor signals and input power to electronic systems. Electrical bonding can also prevent dangerous static discharges in aircraft fuel tanks and hoses.

SUMMARY

In one embodiment, an aircraft electronics system may include a hardware processor, a charge collection circuit to collect charge, a switching circuit controlled by the hardware processor to discharge the charge collected on the charge collection circuit through a bonding circuit formed from a chassis and a bonding surface, and a voltage measurement circuit to measure a voltage difference between measurement terminals across the chassis and the bonding surface.

In certain embodiments, the aircraft electronics system may be implemented as an aircraft avionics system and the charge collection circuit may include one or more capacitors coupled to a voltage source. The hardware processor may provide a signal to the switching circuit to conductively couple the charge collection circuit to the measurement terminals. In certain embodiments, the voltage measurement circuit may include a differential amplifier to output a voltage differential across the measurement terminals.

The aircraft electronics system may also include an analog to digital converter at an output of the differential amplifier for outputting a digital value of the voltage differential across the measurement terminals. Additionally, the hardware processor may operate to indicate a loss-of-bonding warning for voltage differential measurements larger than a predetermined threshold voltage value, which in certain embodiments may be 0.25 V. In other embodiments, the switching circuit may include a p-channel field effect transistor including a gate electrode coupled to the hardware processor, a source electrode coupled to the charge collection circuit, and a drain electrode coupled to the measurement terminals, and may also include a bipolar junction transistor coupled to the hardware processor including a base electrode coupled to the hardware processor, an emitter coupled to ground, and a collector electrode electrically coupled to the gate electrode of the p-channel field effect transistor.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DETAILED DESCRIPTION

Figure 1:
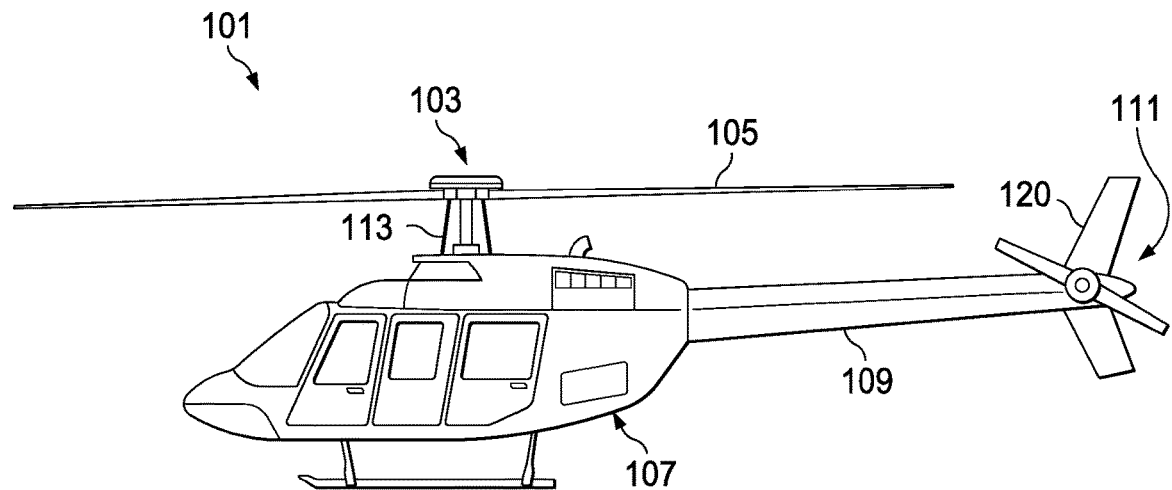
FIG. 1 is a schematic illustration of an example aircraft in accordance with embodiments of the present disclosure.

The following disclosure describes various illustrative embodiments and examples for implementing the features and functionality of the present disclosure. While particular components, arrangements, and/or features are described below in connection with various example embodiments, these are merely examples used to simplify the present disclosure and are not intended to be limiting. It will of course be appreciated that in the development of any actual embodiment, numerous implementation-specific decisions must be made to achieve the developer's specific goals, including compliance with system, business, and/or legal constraints, which may vary from one implementation to another. Moreover, it will be appreciated that, while such a development effort might be complex and time-consuming, it would nevertheless be a routine undertaking for those of ordinary skill in the art having the benefit of this disclosure.

In the specification, reference may be made to the spatial relationships between various components and to the spatial orientation of various aspects of components as depicted in the attached drawings. However, as will be recognized by those skilled in the art after a complete reading of the present disclosure, the devices, components, members, apparatuses, etc. described herein may be positioned in any desired orientation. Thus, the use of terms such as "above," "below," "upper," "lower," or other similar terms to describe a spatial relationship between various components or to describe the spatial orientation of aspects of such components, should be understood to describe a relative relationship between the components or a spatial orientation of aspects of such components, respectively, as the components described herein may be oriented in any desired direction.

Further, the present disclosure may repeat reference numerals and/or letters in the various examples. This repetition is for the purpose of simplicity and clarity and does not in itself dictate a relationship between the various embodiments and/or configurations discussed.

Example embodiments that may be used to implement the features and functionality of this disclosure will now be described with more particular reference to the attached FIGURES.

FIG. 1 is a schematic illustration of an example rotorcraft 101 in accordance with embodiments of the present disclosure. Rotorcraft 101 has a rotor system 103 with a plurality of rotor blades 105. The pitch of each rotor blade 105 can be managed or adjusted in order to selectively control direction, thrust, and lift of rotorcraft 101. Rotorcraft 101 further includes a fuselage 107, anti-torque system 109, and an empennage 111 that can include a horizontal stabilizer 120. Torque is supplied to rotor system 103 and anti-torque system 109 using at least one engine housed in the fuselage 107.

Figure 2:
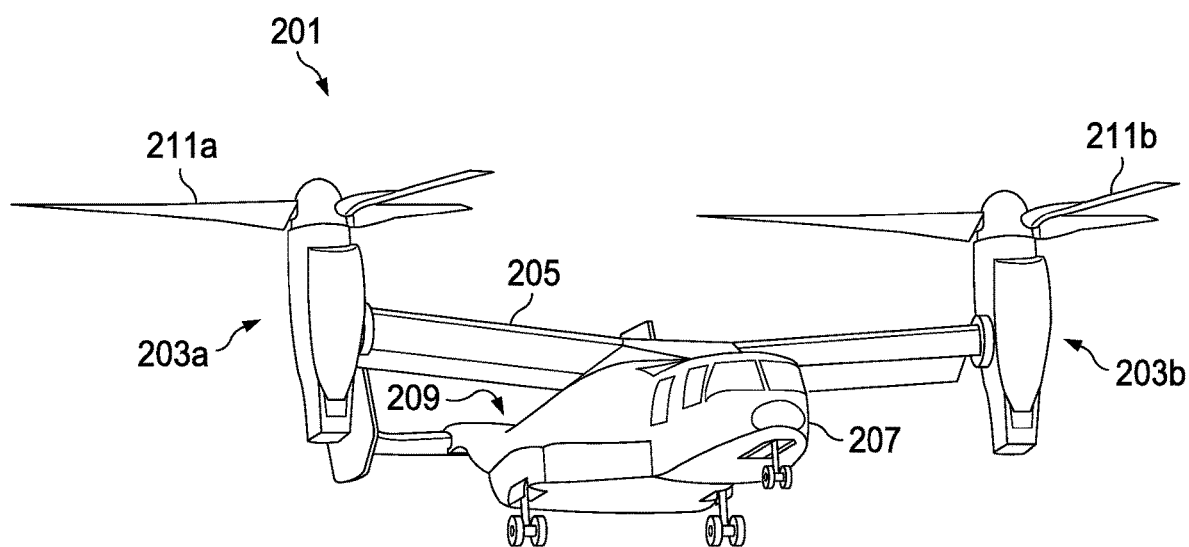
FIG. 2 is a schematic illustration of another example aircraft in accordance with certain embodiments.

FIG. 2 illustrates a perspective view of an example tiltrotor aircraft 201. Tiltrotor aircraft 201 can include nacelles 203a and 203b, a wing 205, a fuselage 207, and a tail member 209. Each nacelle 203a and 203b can include an engine and gearbox for driving rotor systems 211a and 211b, respectively. Nacelles 203a and 203b are each configured to rotate between a helicopter mode, in which the nacelles 203a and 203b are approximately vertical, and an airplane mode, in which the nacelles 203a and 203b are approximately horizontal.

It should be appreciated that rotorcraft 101 of FIG. 1 and tiltrotor aircraft 201 of FIG. 2 are merely illustrative of a variety of aircraft that can be used to implement embodiments of the present disclosure. Other aircraft implementations can include, for example, fixed wing airplanes, hybrid aircraft, unmanned aircraft, gyrocopters, a variety of helicopter configurations, and drones, among other examples. Moreover, it should be appreciated that even though aircraft are particularly well-suited to implement embodiments of the present disclosure, the described embodiments can also be implemented using non-aircraft vehicles and devices.

Avionics units and other computer-based control systems for aircraft require proper electrical bonding in order to function properly. Radiated electromagnetic fields and lightning transients can disrupt the operation of computers, analog electronic systems, and digital electronics systems because the electrical noise couples onto the sensitive signals and input power inside the electronic systems and/or computers. Filter pin connectors on the units and transient suppressors which help to filter out the noise in the units require a discharge path to aircraft ground. Typically, expensive ground support equipment is used to check the avionic units for bonding when they are first installed, but are seldom used as a periodic check for good aircraft bonding and are never used during flight. This ground support equipment is specialized and capable of measuring bonding impedance in the range of 2 milli-ohms and less, which is typically required for proper electrical bonding of electronic equipment. Aircraft fluids and contamination can further degrade the aircraft bonding by causing a high impedance path to the aircraft ground. Hydraulic fluid, gear oil, salt, and water are typical contaminants that may degrade the aircraft bonding path.

This disclosure describes a capacitive discharge system that can be integrated into an aircraft computer system, such as an avionics system, to check the integrity of electrical bonding. Electrical bonding can degrade in an aircraft environment. An integrated bonding sensor is feasible and practical for a microprocessor based unit and can allow for electrical bonding to be checked in-flight and through automation. The circuits and systems described herein can be integrated onto existing electronics circuit boards and controlled through existing processors or other control systems with minimal processing overhead.

Figure 3:
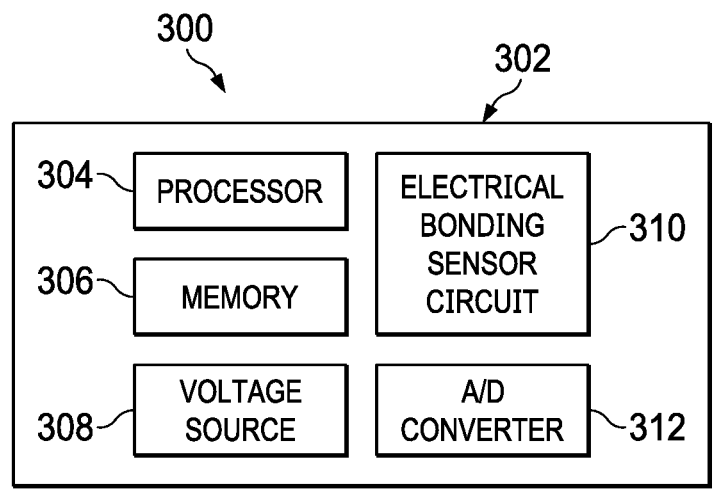
FIG. 3 is a schematic diagram of an aircraft electronics system that includes an integrated electrical bonding sensor circuit in accordance with embodiments of the present disclosure.

FIG. 3 is a schematic diagram of an aircraft electronics system 300 that includes an integrated electrical bonding assurance circuit in accordance with embodiments of the present disclosure. The aircraft electronics system 300 can be, for example, an avionics electronics system or other aircraft system. The aircraft electronics system 300 can include a chassis 302 that houses one or more electronic devices, circuits, and/or subsystems. The chassis 302 can be a metal chassis that is secured to an airframe of the aircraft or to another rigid structure of the aircraft that can provide a bonding surface. The aircraft electronics system 300 can include a hardware processor 304. The hardware processor 304 can be a central processor, microcontroller, or other hardware processor implementation. The hardware processor 304 can also execute instructions stored on memory 306. Memory 306 can store instructions that cause the hardware processor 304 to provide a signal (e.g., a periodic signal) to the electrical bonding sensor circuit 310 to measure a voltage differential across measurement terminals for electrical bonding assurance for the aircraft electronics system 300. The electrical bonding sensor circuit 310 can generally include a switching circuit that can electrically couple a charge collection circuit to a measurement terminal. The charge collection circuit can be coupled to a voltage source 308 and can include one or more capacitors that store charge. Periodically or at predetermined points in time, the hardware processor 304 can provide a signal to the switching circuit to couple the charge collection circuit to the measurement terminals. Electrically coupling the charge collection circuit to the measurement terminals can cause the charge collection circuit discharge, thereby providing current to the terminals (e.g., by closing a circuit between the charge collection circuit and the measurement terminals). A voltage differential can be measured across the measurement terminals by a measurement circuit discussed further below. The voltage differential is created when a specified amount of current is supplied across a resistive bonding interface (the measurement terminals). In equation form (Ohm's Law): $V = I \times R$ where V is the voltage differential, I is the supplied current, and R is the resistive bonding interface (measurement terminals).

The measurement terminals can be terminals coupled to predetermined locations on the aircraft electronics system to measure electrical bonding. For example, a first terminal can be coupled to a chassis 302 that supports the aircraft electronics system. A second terminal can be coupled to an electrical bonding surface, such as the aircraft airframe or ground plane.

In embodiments, the aircraft electronics system 300 can include an analog-to-digital converter (ADC) 312. The electrical bonding sensor circuit 310 can output a voltage differential measurement to the ADC 312, which can output a digital representation of the voltage differential to the hardware processor 304. The hardware processor 304 can use the digital representation of the voltage differential to determine whether the aircraft electronics system 300 is experiencing a loss of electrical bonding. The hardware processor 304 can signal a low bonding detection for voltage differential values above a predetermined threshold value. For example, a voltage differential above 0.25 volts measured across the chassis and bonding surface can indicate a loss of electrical bonding. This voltage differential of 0.25 volts is created when 100 amps are supplied to the measurement terminals with a resistance of 2.5 milli-ohms.

The system 300 may include one or more buses, such as a system bus and a memory bus, for enabling electronic communication between system components. The hardware processor 304, which may also be referred to as a central processing unit (CPU), can include any general or special-purpose processor capable of executing machine-readable instructions and performing operations on data as instructed by the machine-readable instructions. Memory 306 may be directly accessible by the hardware processor for accessing machine-readable instructions and may be in the form of random access memory (RAM) or any type of dynamic storage (e.g., dynamic random access memory (DRAM)). System 300 may also include non-volatile memory, such as a hard disk, that is capable of storing electronic data including executable software files. Externally stored electronic data may be provided to system 300 through one or more removable media drives, which may be configured to receive any type of external media such as compact discs (CDs), digital video discs (DVDs), flash drives, external hard drives, etc.

System 300 may also include a user interface to allow a user to interact with the system. Such a user interface may include a display device such as a graphical display device (e.g., plasma display panel (PDP), a liquid crystal display (LCD), a cathode ray tube (CRT), etc.). In addition, any appropriate input mechanism may also be included such as a keyboard, a touch screen, a mouse, a trackball, voice recognition, touch pad, etc. As used herein, "removable media drive" refers to a drive configured to receive any type of external computer-readable media. Instructions embodying the activities or functions described herein may be stored on one or more external computer-readable media. Additionally, such instructions may also, or alternatively, reside at least partially within a memory element (e.g., in main memory or cache memory of hardware processor 304 during execution, or within a non-volatile memory element of system 300. Accordingly, other memory elements of system 300 also constitute computer-readable media. Thus, "computer-readable medium" is meant to include any medium that is capable of storing instructions for execution by system 300 that cause the system to perform any one or more of the activities disclosed herein.

Figure 4:
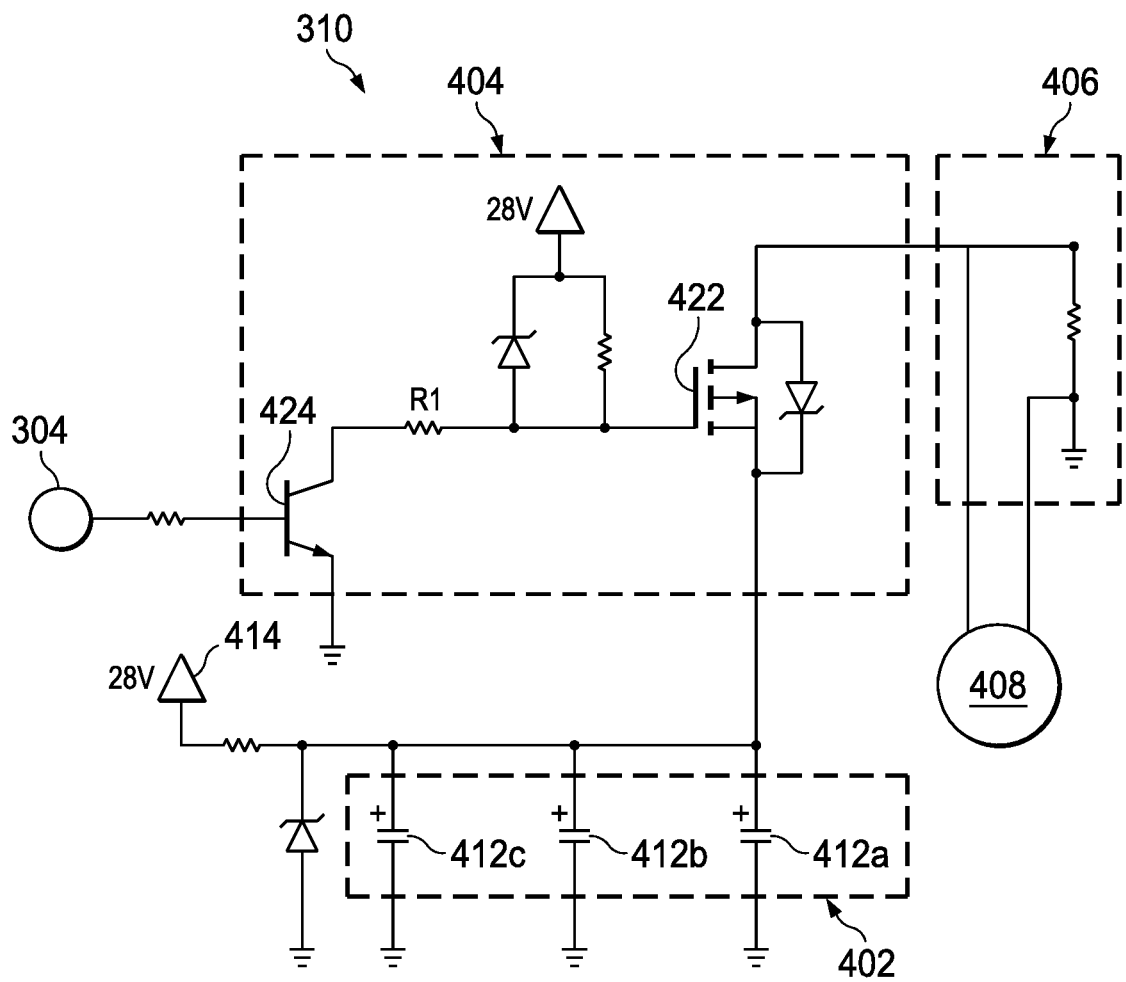
FIG. 4 is a schematic diagram of an example electrical bonding sensor circuit in accordance with embodiments of the present disclosure.
Figure 5:
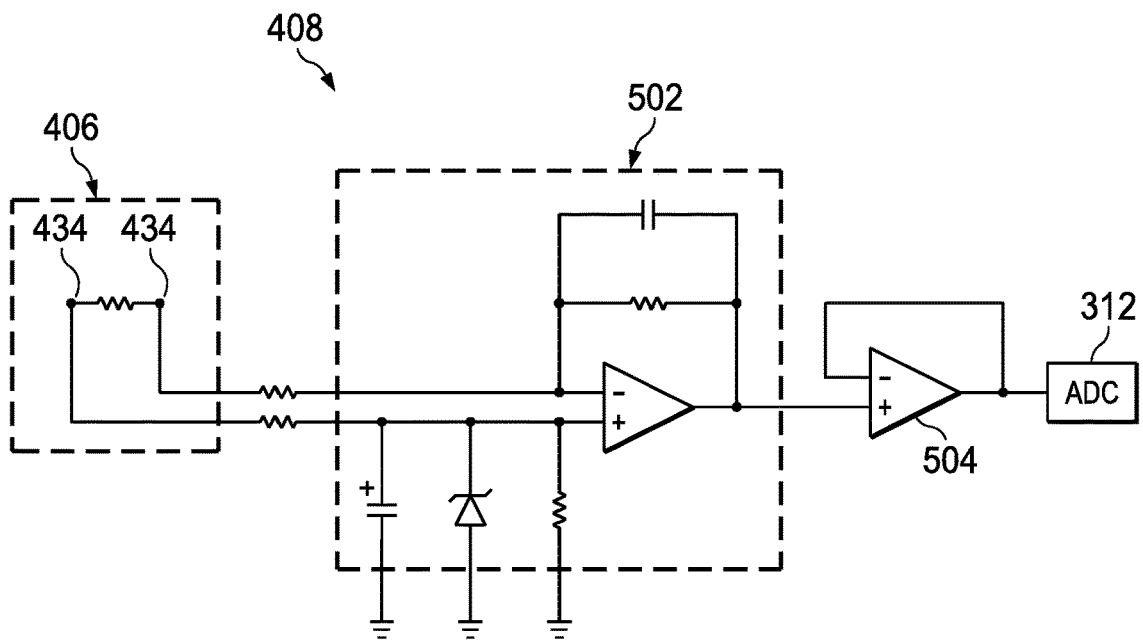
FIG. 5 is a schematic diagram of an example voltage differential measurement circuit in accordance with embodiments of the present disclosure.

An example electrical bonding sensor circuit 310 is shown in FIGS. 4-5.

FIG. 4 is a schematic diagram of an example electrical bonding sensor circuit 310 in accordance with embodiments of the present disclosure. The electrical bonding sensor circuit 310 includes a charge collection circuit 402, a switching circuit 404, a measurement terminal 406, and a voltage differential measurement circuit 408. An example voltage differential measurement circuit 408 is illustrated in FIG. 5.

The charge collection circuit 402 is shown to include a plurality of capacitors 412a-c. It is understood that the charge collection circuit 402 can include one or more capacitors, depending on the implementation selected. In operation, the voltage source 414 can charge the one or more capacitors 412a-c, and once charged, the capacitors 412a-c can store the charge until the switching circuit 404 electrically couples the capacitors 412a-c to the measurement terminal 406.

An example switching circuit 404 is also illustrated. The example switching circuit 404 shown in FIG. 4 includes a p-channel field effect transistor (P-FET) 422. P-FET 422 includes a source that is coupled to the output of the charge collection circuit 402. The drain of the P-FET 422 is coupled to the measurement terminal 406. When the P-FET 422 is "turned on" (e.g., by applying a negative bias on the transistor gate electrode), the P-FET 422 electrically couples the charge collection circuit 402 to the measurement terminal 406. The switching circuit 404 can be controlled by the hardware processor 304. A switching element, such as a bipolar junction transistor (BJT) 424, can be electrically coupled to a signaling pin or output port from the hardware processor 304. The hardware processor can activate the BJT 424. In doing so, the gate electrode from the P-FET, which is electrically coupled to the collected of the BJT 424, gets coupled to ground. The bias on the gate of the P-FET 422 switches the P-FET 422 into an "on" state.

Once the P-FET 422 is in the on state, the charged capacitors 412a-c discharge current into the measurement terminal 406. The measurement terminal 406 includes a first lead that may be coupled to the chassis 302 of the aircraft electronics system and a second lead that may be coupled to a bonding surface. The charge stored in the capacitors 412a-c is discharged through a conductive path formed between the chassis and the bonding surface. A voltage differential measurement circuit 408 can measure a voltage differential between the chassis and the bonding surface. The voltage differential can be used by the hardware processor to determine whether the bonding between the chassis and the bonding surface is degrading. FIG. 5 is a schematic diagram of an example voltage differential measurement circuit 408 in accordance with embodiments of the present disclosure. The voltage differential measurement circuit 408 can include a differential amplifier 502 that outputs an amplified difference between the two input voltages. The output of the differential amplifier 502 may be proportional to the difference between the two input voltages. The input voltages of the differential amplifier 502 are (1) the voltage at the first lead of the measurement terminal 406 and (2) the voltage at the second lead of the measurement terminal 406. The output of the differential amplifier 502 can be provided to a closed-loop operational amplifier 504 for gain purposes, and then provided to ADC 312.

The ADC 312 can convert the analog output of the differential amplifier 502 into a digital value (e.g., binary, hexadecimal, etc.). The ADC 312 can provide a digital value representative of the voltage differential across the measurement terminal to the hardware processor 304. The hardware processor 304 can determine whether the voltage differential across the measurement terminal 406 indicates a loss or potential loss of bonding. If the hardware processor determines a loss or potential loss of bonding, the hardware processor can provide a signal (e.g., to the pilot or other flight personnel) that the aircraft electronics system is experiencing a potential loss of bonding, and that service for the aircraft electronics system is due. This bonding status may also be stored into the processor memory for maintenance personnel to access post-flight. There are several potential implementation choices for warning indicators. For example, in implementation, a range of voltage differentials can be used to provide a granular picture of the quality of the electrical bonding of the aircraft electronics system. For example, for a voltage differential between zero and 0.1 volts, the bonding can be indicated as normal; for 0.1-0.24 volts, a signal that bonding is losing integrity can be provided; for 0.25 volts and above, the warning can indicate a loss of bonding.

The hardware processor 304 can switch off the switching circuit 404 by e.g., disabling the BJT 424. When the charge collection circuit 402 is decoupled from the measurement terminal 406, the voltage source 414 can charge the capacitors 412a-c. The hardware processor 304 can periodically, or at predetermined points in time, signal the switching circuit to activate to obtain updated (and in-flight) electrical bonding information.

Figure 6:
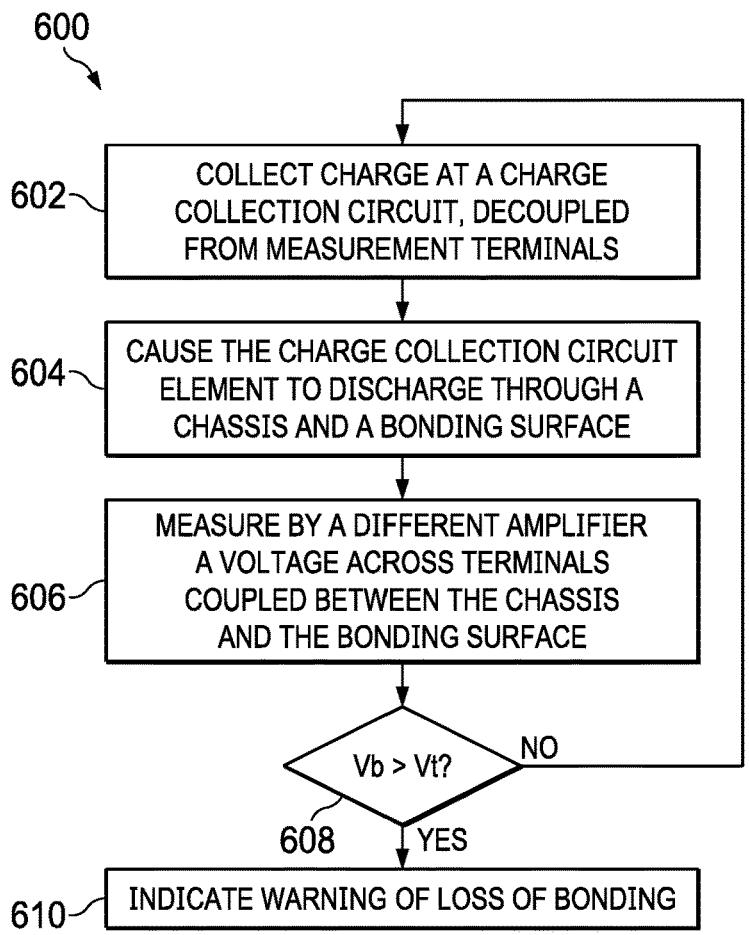
FIG. 6 is a process flow diagram for determining electrical bonding integrity in an aircraft electronics system in accordance with embodiments of the present disclosure.

FIG. 6 is a process flow diagram 600 for determining electrical bonding integrity in an aircraft electronics system in accordance with embodiments of the present disclosure. During an "off" state, in which no measurements are taken, a voltage source can charge a charge collection circuit (which can include one or more capacitors) (602). When the hardware processor wants to update the electrical bonding integrity information, the hardware processor can couple, by a switching circuit, the charge collection circuit to a measurement terminal, which causes the charge collection circuit to discharge through the chassis and the bonding surface (604). The voltage differential across the chassis and the bonding surface can be measured by a measurement circuit (606). For voltage differential values (Vd) greater than a threshold voltage differential value (Vt) (608), the hardware processor can signal a warning (610). For voltage differential values (Vd) less than the threshold voltage differential value (Vt) (608), the hardware processor can decouple the charge collection circuit from the measurement terminals, which can cause the charge collection circuit to collect and store charge (602).

The flowcharts and diagrams in the FIGURES illustrate the architecture, functionality, and operation of possible implementations of various embodiments of the present disclosure. It should also be noted that, in some alternative implementations, the function(s) associated with a particular block may occur out of the order specified in the FIGURES. For example, two blocks shown in succession may, in fact, be executed substantially concurrently, or the blocks may sometimes be executed in the reverse order or alternative orders, depending upon the functionality involved.

In example implementations, at least some portions of the activities described herein may be implemented in software. In some embodiments, this software could be received or downloaded from a web server, provided on computer-readable media, or configured by a manufacturer of a particular element in order to implement the embodiments described herein. In some embodiments, one or more of these features may be implemented in hardware, provided external to these elements, or consolidated in any appropriate manner to achieve the intended functionality.

In some of the example embodiments, one or more memory elements can store data used in implementing embodiments described and illustrated herein. This includes at least some of the memory elements being able to store instructions (e.g., software, logic, code, etc.) that are executed to carry out the activities described in this Specification. A processor can execute any type of instructions associated with the data to achieve the operations detailed herein in this Specification. In one example, one or more processors (e.g., processor 202) could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., a field programmable gate array (FPGA), an erasable programmable read only memory (EPROM), an electrically erasable programmable read only memory (EEPROM)), an ASIC that includes digital logic, software, code, electronic instructions, flash memory, optical disks, CD-ROMs, DVD ROMs, magnetic or optical cards, other types of machine-readable media suitable for storing electronic instructions, or any suitable combination thereof.

Components of the system described herein may maintain information in any suitable type of memory (e.g., random access memory (RAM), read-only memory (ROM), erasable programmable ROM (EPROM), electrically erasable programmable ROM (EEPROM), etc.), software, hardware, or in any other suitable component, device, element, or object where appropriate and based on particular needs. Any of the memory items discussed herein should be construed as being encompassed within the broad term "memory" or "memory element."

Although several embodiments have been illustrated and described in detail, numerous other changes, substitutions, variations, alterations, and/or modifications are possible without departing from the spirit and scope of the present invention, as defined by the appended claims. The particular embodiments described herein are illustrative only, and may be modified and practiced in different but equivalent manners, as would be apparent to those of ordinary skill in the art having the benefit of the teachings herein. Those of ordinary skill in the art would appreciate that the present disclosure may be readily used as a basis for designing or modifying other embodiments for carrying out the same purposes and/or achieving the same advantages of the embodiments introduced herein. For example, certain embodiments may be implemented using more, less, and/or other components than those described herein. Moreover, in certain embodiments, some components may be implemented separately, consolidated into one or more integrated components, and/or omitted. Similarly, methods associated with certain embodiments may be implemented using more, less, and/or other steps than those described herein, and their steps may be performed in any suitable order.

Numerous other changes, substitutions, variations, alterations, and modifications may be ascertained to one of ordinary skill in the art and it is intended that the present disclosure encompass all such changes, substitutions, variations, alterations, and modifications as falling within the scope of the appended claims.

In order to assist the United States Patent and Trademark Office (USPTO), and any readers of any patent issued on this application, in interpreting the claims appended hereto, it is noted that: (a) Applicant does not intend any of the appended claims to invoke paragraph (f) of 35 U.S.C. § 112, as it exists on the date of the filing hereof, unless the words "means for" or "steps for" are explicitly used in the particular claims; and (b) Applicant does not intend, by any statement in the specification, to limit this disclosure in any way that is not otherwise expressly reflected in the appended claims.

What is claimed is:

1. An aircraft electronics system comprising:
 a hardware processor;
 a charge collection circuit to collect charge;
 a switching circuit controlled by the hardware processor to discharge the charge collected on the charge collection circuit through a bonding circuit formed from a chassis and a bonding surface; and
 a voltage measurement circuit to measure a voltage difference between measurement terminals across the chassis and the bonding surface;
 wherein the switching circuit comprises a p-channel field effect transistor comprising a gate electrode coupled to the hardware processor, a source electrode coupled to the charge collection circuit, and a drain electrode coupled to the measurement terminals; and
 wherein the switching circuit further comprises a bipolar junction transistor comprising a base electrode coupled to the hardware processor, an emitter coupled to ground, and a collector electrode electrically coupled to the gate electrode of the p-channel field effect transistor.

2. The aircraft electronics system of claim 1, wherein the aircraft electronics system comprises an aircraft avionics system.

3. The aircraft electronics system of claim 1, wherein the charge collection circuit comprises one or more capacitors coupled to a voltage source.

4. The aircraft electronics system of claim 1, wherein the hardware processor is configured to provide a signal to the switching circuit to conductively couple the charge collection circuit to the measurement terminals.

5. The aircraft electronics system of claim 1, wherein the voltage measurement circuit comprises a differential amplifier to output a voltage differential across the measurement terminals.

6. The aircraft electronics system of claim 5, further comprising an analog to digital converter at an output of the differential amplifier, the analog to digital converter configured to output a digital value of the voltage differential across the measurement terminals.

7. The aircraft electronics system of claim 6, wherein the hardware processor is configured to indicate a loss-of-bonding warning for voltage differential measurements larger than a predetermined threshold voltage value.

8. The aircraft electronics system of claim 7, wherein the predetermined threshold voltage value is 0.25 V.

9. A rotorcraft, comprising:
an avionics electronics system comprising:
a chassis coupled to a ground plane;
a hardware processor;
a charge collection circuit to collect charge;
a switching circuit controlled by the hardware processor to discharge the charge collected on the charge collection circuit through a bonding circuit formed from the chassis and a bonding surface; and
a voltage measurement circuit to measure a voltage difference between measurement terminals across the chassis and the bonding surface;
wherein the switching circuit comprises a p-channel field effect transistor comprising a gate electrode coupled to the hardware processor, a source electrode coupled to the charge collection circuit, and a drain electrode coupled to the measurement terminals; and
wherein the switching circuit further comprises a bipolar junction transistor comprising a base electrode coupled to the hardware processor, an emitter coupled to ground, and a collector electrode electrically coupled to the gate electrode of the p-channel field effect transistor.

10. The rotorcraft of claim 9, wherein the charge collection circuit comprises one or more capacitors coupled to a voltage source.

11. The rotorcraft of claim 9, wherein the hardware processor is configured to provide a signal to the switching circuit to conductively couple the charge collection circuit to the measurement terminals.

12. The rotorcraft of claim 9, wherein the voltage measurement circuit comprises a differential amplifier to output a voltage differential across the measurement terminals.

13. The rotorcraft of claim 12, further comprising an analog to digital converter at an output of the differential amplifier, the analog to digital converter to output a digital value of the voltage differential across the measurement terminals.

14. The rotorcraft of claim 13, wherein the hardware processor is configured to indicate a loss-of-bonding warning for voltage differential measurements larger than a predetermined threshold voltage value.

15. The rotorcraft of claim 14, wherein the predetermined threshold voltage value is 0.25 V.

16. A method for determining electrical bonding integrity, the method comprising:
charging a charge collecting circuit;
activating a switch to automatically couple the charge collecting circuit to one or more bonding measurement terminals;
measuring a voltage differential across the bonding measurement terminals;
determining that the voltage differential across the bonding measurement terminals is above a threshold voltage value; and
providing an electrical bonding warning indicator that indicates a loss of electrical bonding subsequent to the determining;
wherein the switch comprises a p-channel field effect transistor comprising a gate electrode coupled to a hardware processor, a source electrode coupled to the charge collecting circuit, and a drain electrode coupled to the bonding measurement terminals; and
wherein the switch further comprises a bipolar junction transistor comprising a base electrode coupled to the hardware processor, an emitter coupled to ground, and a collector electrode electrically coupled to the gate electrode of the p-channel field effect transistor.

* * * * *